US007812362B2

(12) United States Patent
Shylo et al.

(10) Patent No.: US 7,812,362 B2
(45) Date of Patent: Oct. 12, 2010

(54) WHITE LIGHT EMITTING DIODE AND METHOD OF MANUFACTURING THE SAME

(75) Inventors: Sergiy Shylo, Gyeonggi-do (KR); Dong Ik Shin, Gyeonggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/081,273

(22) Filed: Apr. 14, 2008

(65) Prior Publication Data
US 2009/0134412 A1    May 28, 2009

(30) Foreign Application Priority Data
Nov. 22, 2007    (KR)   ................. 10-2007-0119898

(51) Int. Cl.
*H01L 33/48*    (2010.01)
(52) U.S. Cl. .................. 257/98; 257/E33.067; 438/29
(58) Field of Classification Search .................. 257/98, 257/100, E33.068, E33.069, E33.061, E33.067; 438/29
See application file for complete search history.

(56) References Cited

U.S. PATENT DOCUMENTS 6,155,699 A * 12/2000 Miller et al. ................. 362/293

2007/0012940 A1 * 1/2007 Suh et al. ...................... 257/99
2007/0045641 A1 * 3/2007 Yin Chua et al. ............. 257/98
2008/0054803 A1 * 3/2008 Zheng et al. ................ 313/506

FOREIGN PATENT DOCUMENTS

JP        2007-059864       3/2007
KR        10-0665219 B1    12/2006

OTHER PUBLICATIONS

Korean Notice of Allowance issued in Korean Patent Application No. KR 10-2007-0119898, dated Feb. 27, 2009.

* cited by examiner

*Primary Examiner*—Victor A Mandala
*Assistant Examiner*—Scott Stowe
(74) *Attorney, Agent, or Firm*—McDermott Will & Emery LLP

(57) ABSTRACT

Provided is a white LED including a reflector cup; an LED chip mounted on the bottom surface of the reflector cup; transparent resin surrounding the LED chip; a phosphor layer formed above the transparent resin; and a reflecting film interposed between the transparent resin and the phosphor layer, the reflecting film reflecting phosphorescence, which is directed downward from the phosphor layer, in the upward direction.

28 Claims, 3 Drawing Sheets

[FIG. 1]
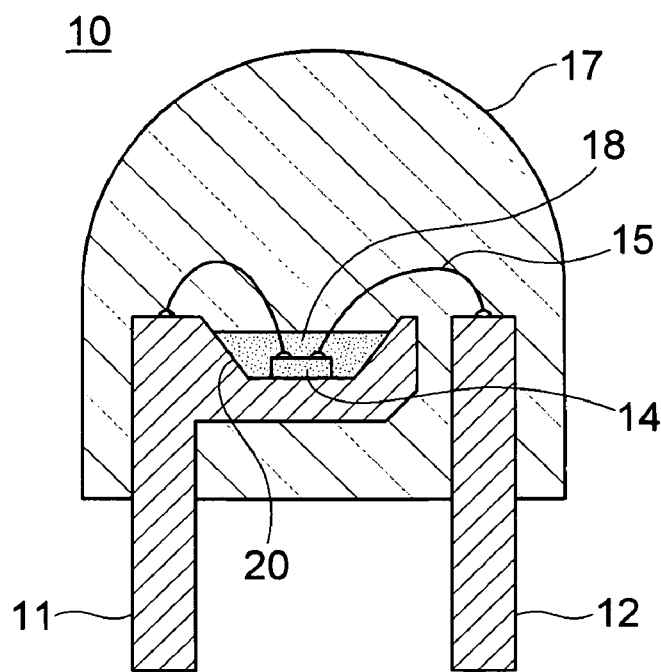
[FIG. 2A]
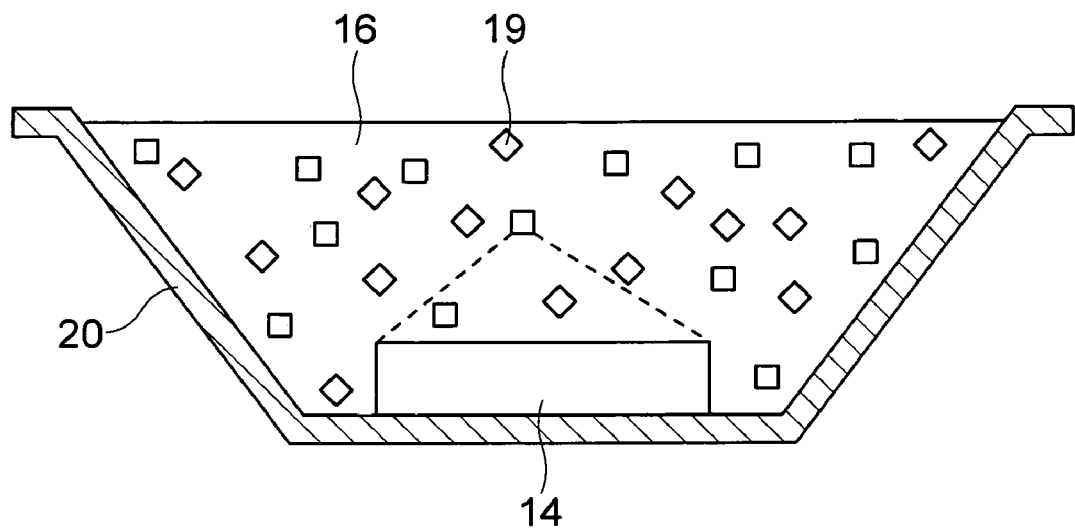

[FIG. 2B]
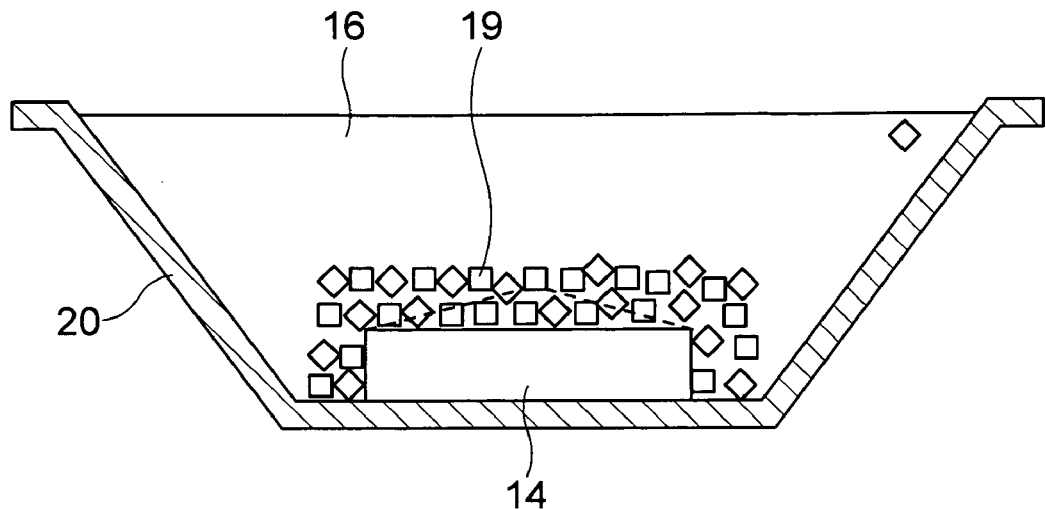
[FIG. 3]
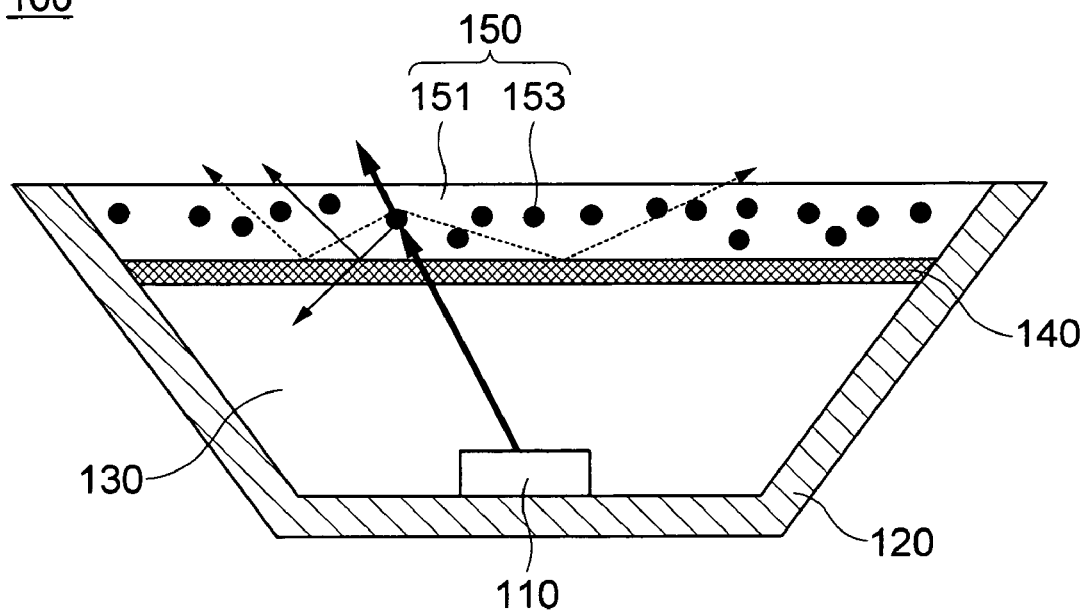

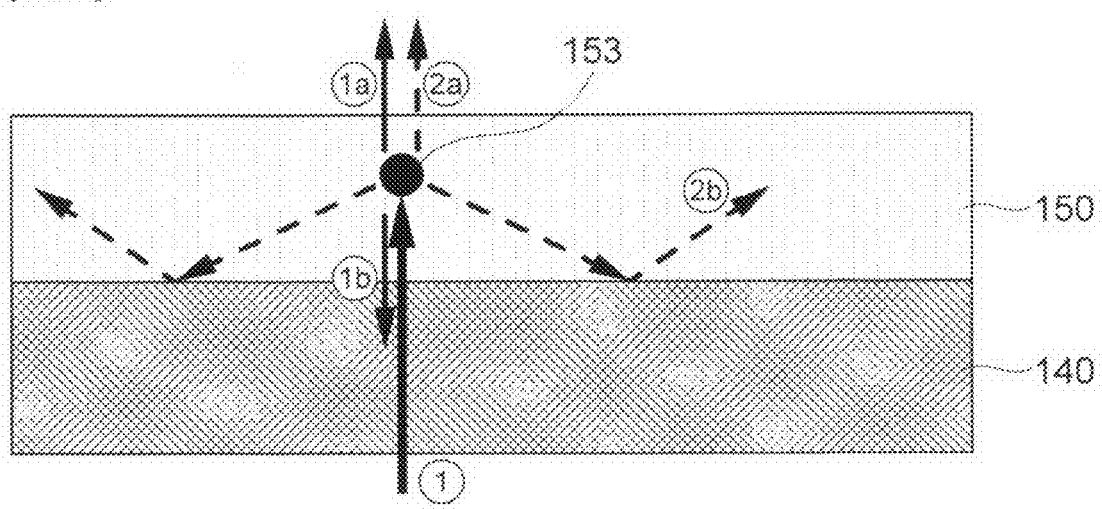
[FIG. 4]

WHITE LIGHT EMITTING DIODE AND METHOD OF MANUFACTURING THE SAME

CROSS-REFERENCE TO RELATED APPLICATIONS

This application claims the benefit of Korean Patent Application No. 10-2007-0119898 filed with the Korea Intellectual Property Office on Nov. 22, 2007, the disclosure of which is incorporated herein by reference.

BACKGROUND OF THE INVENTION

1. Field of the Invention

The present invention relates to a white light emitting diode (LED) and a method of manufacturing the same.

2. Description of the Related Art

An LED is referred to as a device which generates minority carriers (electrons or holes) injected by using the p-n junction structure of semiconductor and emits light by recombining the minority carriers. As for the LED, a red LED using GaAsP or the like, a green LED using GaP or the like, and a blue LED using InGaN/AlGaN double hetero structure are provided.

The LED has low power consumption and a long lifespan. Further, the LED can be installed in a narrow space, and has high resistance to vibration. The LED is used as a display device and a backlight unit. Recently, researches are being actively conducted to apply the LED as a general lighting.

Recently, white LEDs as well as red, blue, or green LEDs are launched on the market.

Since the white LEDs can be applied to various fields, it is expected that demand for the white LEDs is rapidly increasing.

A technique for implementing white light in the LED can be roughly divided into two techniques.

In the first technique, red, green, and blue LED chips are installed adjacent to each other, and lights emitted from the respective LED chips are mixed to implement white light. However, since the respective LED chips have different thermal or time characteristics, the color tones of the LED chips are changed depending on the surrounding environment. In particular, color spots may occur, which makes it difficult to implement a uniform mixed color.

In the second technique, phosphor is disposed in an LED chip. Some of primarily-emitted light from the LED chip and secondarily-emitted light, of which the wavelength is converted by the phosphor, are mixed to implement white light. That is, phosphor which is excited by ultraviolet (UV) light so as to emit visible light from blue to red is coated on the LED chip which emits UV light, thereby obtaining white light. Alternately, on an LED chip which emits blue light, phosphor is distributed, the phosphor emitting yellow-green or yellow light by using the blue light as an excitation source. Then, white light can be obtained by the blue light emitted from the LED chip and the yellow-green or yellow light emitted from the phosphor.

Between them, the second technique is generally used. In particular, the technique for implementing white light by using the blue LED chip and the yellow-green or yellow phosphor is most frequently used.

FIG. 1 is a cross-sectional view of a conventional lamp-type white LED which uses a white LED chip and yellow light emitting phosphor so as to implement white light.

As shown in FIG. 1, the lamp-type white LED 10 includes a mount lead 11, an inner lead 12, and an LED chip 14 installed in a reflector cup 20 formed in the upper portion of the mount lead 11. Further, n- and p-electrodes of the LED chip 14 are electrically connected to the mount lead 11 and the inner lead 12, respectively, through a wire 15.

The LED chip 14 is covered by a phosphor layer 150 which is obtained by mixing phosphor materials with transparent resin. The above-described components are surrounded by an encapsulation member 17.

The reflector cup 20 is coated with silver (Ag) and aluminum (Al) to reliably reflect visible light.

FIGS. 2A and 2B are diagrams simply showing a case where phosphor materials are disposed in the reflector cup.

As shown in the drawings, the LED chip 14 is mounted on the bottom surface of the reflector cup 20, and the transparent resin 16 is filled in the reflector cup 20. Further, the phosphor materials 19 are distributed in the transparent resin 16.

As shown in FIG. 2A, the phosphor materials 19 may be uniformly distributed in the transparent resin 16. Alternately, as shown in FIG. 2B, the phosphor materials 19 may be concentrated on the surface of the LED chip 14.

When a current is applied, the LED 10 including the phosphor materials 19 mixed with the transparent resin 16 implements white light by combining blue light emitted from the LED chip 14 and yellow light emitted from the phosphor materials 16 using some of the blue light as an excitation source.

However, some of light emitted from the phosphor materials 19, which are excited by the light emitted from the LED chip 14, collides with the surface of the LED chip 14 so as to be re-absorbed. Therefore, light emission efficiency decreases.

As shown in FIG. 2B, when the phosphor materials 19 are concentrated on the surface of the LED chip 14, it is highly likely that the light emitted from the phosphor materials 19 collides with the surface of the LED chip 14, compared with the case where the phosphor materials 19 are uniformly distributed in the transparent resin 16. Therefore, the light emission characteristic is degraded.

SUMMARY OF THE INVENTION

An advantage of the present invention is that it provides a white LED in which only transparent resin is provided to surround an LED chip mounted on the bottom surface of a reflector cup, a phosphor layer is formed on the transparent resin, and a reflecting film is interposed between the transparent resin and the phosphor layer so as to reflect light, directed to the LED chip from the phosphor layer, in the upward direction, thereby enhancing light efficiency.

Another advantage of the invention is that it provides a method of manufacturing a white LED.

Additional aspects and advantages of the present general inventive concept will be set forth in part in the description which follows and, in part, will be obvious from the description, or may be learned by practice of the general inventive concept.

According to an aspect of the invention, a white LED comprises a reflector cup; an LED chip mounted on the bottom surface of the reflector cup; transparent resin surrounding the LED chip; a phosphor layer formed above the transparent resin; and a reflecting film interposed between the transparent resin and the phosphor layer, the reflecting film reflecting phosphorescence, which is directed downward from the phosphor layer, in the upward direction.

The transparent resin may be selected from the group consisting of polymethly methacrylate (PMMA), polystyrene, polyurethane, benzoguanamine resin, epoxy, and silicon resin.

The phosphor layer may be formed by mixing transparent resin and phosphor materials. The transparent resin may be selected from the group consisting of PMMA, polystyrene, polyurethane, benzoguanamine resin, epoxy, and silicon resin.

Preferably, the reflecting film is a nano-film, and the thickness of the reflecting film ranges from 1 to 10 nm.

The reflecting film transmits light generated from the LED chip and reflects phosphorescence generated from the phosphor layer. For this, the follow condition should be satisfied: a plasma wavelength of the reflecting film is larger than the wavelength of the light generated from the LED chip and is smaller than the wavelength of the phosphorescence generated from the phosphor layer.

As for a metallic material which satisfies the above-described condition, cesium (Cs) may be exemplified.

The reflecting film may be formed of semiconductor of which the doping concentration is equal to or more than $5\times10^{21}$ cm$^{-3}$.

Preferably, the LED chip includes at least one or more LEDs which generate blue, red, green, and ultraviolet (UV) wavelengths. For example, the phosphor layer may include at least one or more phosphor materials which convert a wavelength into any one of yellow, red, and green.

According to another aspect of the invention, a white LED comprises a reflector cup that is inclined upward; an LED chip that is mounted on the bottom surface of the reflector cup; a molding compound that is formed in the reflector cup so as to surround the LED chip; a phosphor layer that is formed above the molding compound; and a reflecting film that is interposed between the molding compound and the phosphor layer, the reflecting film transmitting light incident from the LED chip and reflecting phosphorescence incident from the phosphor layer.

The thickness of the reflecting film ranges from 1 to 10 nm.

Preferably, a plasma wavelength of the reflecting film is larger than the wavelength of the light generated from the LED chip and is smaller than the wavelength of the phosphorescence generated from the phosphor layer.

The reflecting film may be formed of a metallic material such as Cs or semiconductor with a quasi-metallic characteristic, of which the doping concentration is equal to or more than $5\times10^{21}$ cm$^{-3}$.

According to a further aspect of the invention, a method of manufacturing a white LED comprises the steps of: preparing a reflector cup; mounting an LED chip on the bottom surface of the reflector cup; forming a molding compound in the reflector cup such that the LED chip is surrounded by the molding compound; forming a reflecting film on the molding compound; and forming a phosphor layer on the reflecting film.

The molding compound may be formed of any one selected from the group consisting of PMMA, polystyrene, polyurethane, benzoguanamine resin, epoxy, and silicon resin.

The forming of the phosphor layer includes the steps of: mixing transparent resin with phosphor materials, and then dispensing the transparent resin and the phosphor materials on the reflecting film; and curing the transparent resin and the phosphor materials dispensed on the reflecting film. The transparent resin may be formed of any one selected from the group consisting of PMMA, polystyrene, polyurethane, benzoguanamine resin, epoxy, and silicon resin.

Preferably, the thickness of the reflecting film ranges from 1 to 10 nm. Preferably, a plasma wavelength of the reflecting film is larger than the wavelength of the light generated from the LED chip and is smaller than the wavelength of the phosphorescence generated from the phosphor layer.

The reflecting film may be formed of a metallic material such as Cs or semiconductor of which the doping concentration is equal to or more than $5\times10^{21}$ cm$^{-3}$.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a conventional lamp-type white LED;

FIGS. 2A and 2B are diagrams simply showing a case where phosphor materials are distributed in a reflector cup;

FIG. 3 is a cross-sectional view of a white LED according to the invention; and

FIG. 4 is a diagram showing light extraction of the white LED according to the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a white LED and a method of manufacturing the same according to the present invention will be described in detail with reference to the accompanying drawings.

FIG. 3 is a cross-sectional view of a white LED according to the invention, showing a state where an LED chip is mounted in a reflector cup.

As shown in FIG. 3, the white LED 100 according to the invention includes a reflector cup 120, an LED chip mounted on the bottom surface of the reflector cup 120, a molding compound 130 surrounding the LED chip 110, a phosphor layer 150 formed on the molding compound 130, and a reflecting film 140 interposed between the molding compound 130 and the phosphor layer 150.

The reflector cup 120 has a structure that is inclined upward. Further, the reflector cup 120 is coated with a reflective material for reflecting light which is emitted from the LED chip 110 so as to be directed to a side portion or lower portion of the reflector cup 120.

As for the reflective material, silver (Ag), aluminum (Al) and so on may be used, which have an excellent reflective property with respect to visible light.

The LED chip 110 may include one or more of LEDs which generate blue, red, green and ultraviolet (UV) wavelengths. For example, the LED chip 110 may include only the blue LED or both of the blue and red LEDs.

However, the present invention is not limited to such examples. If blue, red, green and ultraviolet (UV) wavelengths can be generated, an LED chip can be independently used or another combination of LEDs can be used.

The molding compound 130, which is filled in the reflector cup 120 so as to surround the LED chip 110, is composed of transparent resin which can transmit visible light generated from the LED chip 110. For example, the molding compound 130 may be formed of any one of polymethly methacrylate (PMMA), polystyrene, polyurethane, benzoguanamine resin, epoxy, and silicon resin.

The phosphor layer 150 is formed by mixing phosphor materials 153 with transparent resin 151. A material for forming the transparent resin 151 is not specifically limited, if the material can transmit light generated from the LED chip 110 and light emitted from the phosphor materials 153 and can stably disperse the phosphor materials 153. For example, the transparent resin 151 may be formed of any one of PMMA, polystyrene, polyurethane, benzoguanamine resin, epoxy, and silicon resin, like the molding compound 130.

The phosphor materials 153 may be formed of phosphor which converts a wavelength into any one of yellow, red, and green wavelengths. The phosphor materials 153 of the phosphor layer 150 are determined depending on the emission wavelength of the LED chip 110. That is, phosphor materials are used, which can convert light emitted from the LED chip 110 so as to implement white light. For example, when the LED chip 110 generates blue light, the phosphor layer 150 is formed of a phosphor material which can emit yellow light.

As such, when the blue LED and the yellow light emitting phosphor are used, blue light emitted from the LED chip 110 and yellow light emitted from the phosphor materials using some of the blue light as an excitation source are combined at the time of the application of current, thereby implementing white light.

Meanwhile, the reflecting film 140 interposed between the molding compound 130 and the phosphor layer 150 is a nano film with a thickness of 1 to 10 nm.

The reflecting film 140 transmits light incident from the LED chip 110 as it is, and reflects light incident from the phosphor materials 153.

That is, the reflecting film 140 has a function of transmitting light generated from the LED chip 110 as well as a function of reflecting light, which is generated from the phosphor layer 150 so as to be directed downward, in the upward direction. Therefore, it can be found that the reflecting film 140 does not have only the reflection function, but selectively transmits and reflects light depending on the wavelength of light.

As described above, the reflecting film 140 should transmit the light generated from the LED chip 110 as it is, and should reflect phosphorescence of the phosphor layer 150, which is discharged toward the reflecting film 140, so as to be bent in the upward direction.

To selectively perform the transmission function and the reflection function depending on the wavelength of light incident toward the reflecting film 140, the reflecting film 140 should satisfy the following conditions. That is, a plasma wavelength $\lambda_P$ of the reflecting film 140 should be smaller than a wavelength $\lambda_1$ of light generated from the LED chip 110 and should be larger than a wavelength $\lambda_2$ of phosphorescence generated from the phosphor layer 150.

In other words, the reflecting film 140 should transmit a wavelength smaller than the plasma wavelength $\lambda_P$ of the reflecting film 140 and reflect a wavelength larger than the plasma wavelength $\lambda_P$.

Now, the above-described reflection characteristics depending on the wavelength will be described theoretically.

In general, reflectivity R can be calculated by Equation 1 using a refractive index n.

$$R = \frac{(n-1)^2}{(n+1)^2},$$ [Equation 1]

where n represents a refractive index.

Since the square of reflective index is a dielectric constant $\in$, a refractive index function n($\omega$) with respect to a frequency $\omega$ can be expressed by Equation 2 using a dielectric constant function $\in(\omega)$.

$$n(\omega) = \sqrt{\in(\omega)}$$ [Equation 2]

Further, the dielectric constant function $\in(\omega)$ and a plasma frequency $\omega_P$ can be expressed by Equations 3 and 4.

$$\varepsilon(\omega) = 1 - \frac{\omega_P^2}{\omega^2},$$ [Equation 3]

where $\omega_P$ represents a plasma frequency, and $\omega$ represents the frequency of incident light.

Here, the plasma frequency $\omega_P$ means the unique frequency of an incident surface on which light is incident.

$$\omega_P = \frac{Nq^2}{\varepsilon_0 m}$$ [Equation 4]

When the frequency $\omega$ of incident light is smaller than the plasma frequency $\omega_P$ ($\omega < \omega_P$), it may be considered that the wavelength of the incident light is larger than the plasma wavelength ($\lambda > \lambda_P$), because the frequency is inversely proportional to the wavelength.

The dielectric constant becomes negative ($\in(\omega) < 0$) by Equation 3. At this time, when a conditional expression of $|\in(\omega)| = u(\omega) > 0$ is defined, Equation 5 is satisfied by Equation 2.

$$n(\omega) = \sqrt{-|\in(\omega)|} = i\sqrt{|\in(\omega)|} = i\sqrt{|u(\omega)|}$$ [Equation 5]

Continuously, when Equation 5 is substituted to Equation 1, the reflectivity R becomes 1 by the following equation:

$$R = \left|\frac{i\sqrt{u(\omega)} - 1}{i\sqrt{u(\omega)} + 1}\right|^2$$

$$= \frac{(i\sqrt{u(\omega)} - 1)(-i\sqrt{u(\omega)} - 1)}{(i\sqrt{u(\omega)} + 1)(-i\sqrt{u(\omega)} + 1)}$$

$$= 1.$$

When the reflectivity is 1, it indicates that incident light is reflected by 100%.

As described above, the present invention takes advantage of such a characteristic that when the wavelength of incident light is larger than the plasma wavelength of the incident surface, the light is totally reflected. The reflecting film 140 may be formed of a metallic material such as cesium (Cs) or a quasi-metallic material composed of semiconductor, of which the doping concentration is equal to or more than $5 \times 10^{21}$ cm$^{-3}$, so as to discharge the phosphorescence generated from the phosphor materials 153.

In the above-described white LED according to the invention, the reflecting film 140 is provided, which transmits light of the LED chip 110 between the molding compound 130 and the phosphor layer 150 and reflects phosphorescence generated from the phosphor layer 150. Therefore, it is possible to enhance light extraction efficiency.

FIG. 4 is a diagram showing light, which is generated from the LED so as to be transmitted through the reflecting film 140, and phosphorescence which is generated from the phosphor layer so as to be reflected by the reflecting film 140.

As shown in FIG. 4, when blue light (1) is emitted from the LED chip (not shown) positioned under the reflecting film 140, the blue light (1) collides with the phosphor materials 153 so as to excite the phosphor materials 153 distributed in the phosphor layer 150. Then, the blue light (1) is discharged upward (1a) or directed downward (1b). At this time, most of the blue light (1) excites the phosphor materials 153 and is then discharged upward. Most of the blue light incident in the downward direction is reflected by the reflector cup so as to excite the phosphor materials 153 once again, and is then discharged upward.

The phosphor materials 153 excited by the blue light (1a) generate yellow light. Some (2a) of the yellow light is discharged upward with the blue light (1a), and some (2b) of the yellow light is discharged downward.

The light (1b) discharged in the downward direction is reflected by the reflecting film 140 provided under the phosphor layer 150 so as to be bent upward, thereby implementing white light with the blue light. In the conventional white LED, the light directed upward by the reflecting film 140 collides with the LED chip so as to be absorbed. In the present invention, however, the light (2b) reflected upward by the reflecting film 140 contributes to implementing white light, thereby enhancing light extraction efficiency.

Substantially, it is possible to obtain more than 78% of light extraction efficiency through the reflecting film 140.

Meanwhile, the white LED 100 according to the invention is formed by the following process. First, the LED chip 110 is mounted on the bottom surface of the reflector cup 120. After the transparent resin 151 is filled by a jetting method such as dispensing or the like so as to surround the LED chip 110, the transparent resin 151 is cured to form the molding compound 130. Then, the reflecting film 140 and the phosphor layer 150 are continuously laminated on the molding compound 130.

As described above, the inner surface of the reflector cup 120 may be coated with a reflective material such as Al or Ag which reflects light incident on the reflector cup 120 from the LED chip 110 so as to be directed upward.

Further, the reflecting film 140 may be formed on the molding compound 130 through known various deposition methods such as a chemical vapor deposition (CVD) method and so on.

The phosphor layer 150 is formed by the following process. Resin obtained by mixing transparent resin with phosphor materials is coated on the reflecting film 140 by the same method as that for the molding compound, and is then cured to form the phosphor layer 15.

The phosphor layer 150 may be formed by attaching a phosphor film, which is separately manufactured, on the reflecting film 140.

The basic concept of the invention is that the reflecting film which reflects phosphorescence emitted from the phosphor layer 150 is formed between the molding compound 130 and the phosphor layer 150. A method for mounting the LED chip 110, a method for forming the molding compound 130 and the phosphor layer 150, and a method for mounting them on a package are not limited specifically, but various known methods can be used.

The white LED 100 constructed in the above-described manner bents light, emitted from the phosphor layer 150, in the upward direction through the reflecting film 140 by using light generated from the LED chip 110 as an excitation source, thereby enhancing the light extraction efficiency.

In the conventional white LED, the phosphor materials are distributed in the molding compound, and some of phosphorescence, which is generated from the phosphor materials so as to be discharged downward, collides with the LED chip so as to be absorbed. Therefore, an optical loss occurs.

In the present invention, however, the molding compound is formed of only transparent resin, and the phosphor layer is formed on the molding compound. Further, the reflecting film, which transmits light generated from the LED chip and reflects light generated from the phosphor layer, is provided between the molding compound and the phosphor layer. Therefore, light which is generated from the phosphor layer so as to be directed downward is all bent upward, thereby enhancing the light extraction efficiency.

That is, the technical feature of the invention is that the reflecting film, which transmits short-wavelength light generated from the LED chip and reflects long-wavelength light generated from the phosphor layer, is provided between the molding compound for covering the LED chip and the phosphor layer. Therefore, if white LEDs include the technical feature regardless of the mounting method of the LED chip and the packaging method, they are included in the present invention.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A white light emitting diode (LED) comprising:
   a reflector cup;
   an LED chip mounted on the bottom surface of the reflector cup;
   a transparent resin surrounding the LED chip;
   a phosphor layer formed above the transparent resin; and
   a reflecting film interposed between the transparent resin and the phosphor layer, the reflecting film reflecting phosphorescence, which is directed downward from the phosphor layer, in the upward direction,
   wherein a plasma wavelength of the reflecting film is larger than the wavelength of the light generated from the LED chip and is smaller than the wavelength of the phosphorescence generated from the phosphor layer.

2. The white LED according to claim 1, wherein the transparent resin is selected from the group consisting of polymethly methacrylate (PMMA), polystyrene, polyurethane, benzoguanamine resin, epoxy, and silicon resin.

3. The white LED according to claim 1, wherein the phosphor layer is formed by mixing transparent resin and phosphor materials.

4. The white LED according to claim 3, wherein the transparent resin is selected from the group consisting of PMMA, polystyrene, polyurethane, benzoguanamine resin, epoxy, and silicon resin.

5. The white LED according to claim 1, wherein the reflecting film is a nano-film.

6. The white LED according to claim 1, wherein the thickness of the reflecting film ranges from 1 to 10 nm.

7. The white LED according to claim 1, wherein the reflecting film transmits light generated from the LED chip and reflects phosphorescence generated from the phosphor layer.

8. The white LED according to claim 1, wherein the reflecting film is formed of a metallic material.

9. The white LED according to claim 8, wherein the reflecting film is formed of cesium (Cs).

10. The white LED according to claim 1, wherein the reflecting film is formed of a quasi-metallic material.

11. The white LED according to claim 10, wherein the reflecting film is formed of semiconductor of which the doping concentration is equal to or more than $5 \times 10^{21}$ cm$^{-3}$.

12. The white LED according to claim 1, wherein the LED chip includes at least one or more LEDs which generate blue, red, green, and ultraviolet (UV) wavelengths.

13. The white LED according to claim 1, wherein the phosphor layer includes at least one or more phosphor materials which convert a wavelength into any one of yellow, red, and green.

14. A white LED comprising:
a reflector cup that is inclined upward;
an LED chip that is mounted on the bottom surface of the reflector cup;
a molding compound that is formed in the reflector cup so as to surround the LED chip;
a phosphor layer that is formed above the molding compound; and
a reflecting film that is interposed between the molding compound and the phosphor layer, the reflecting film transmitting light incident from the LED chip and reflecting phosphorescence incident from the phosphor layer,
wherein a plasma wavelength of the reflecting film is larger than the wavelength of the light generated from the LED chip and is smaller than the wavelength of the phosphorescence generated from the phosphor layer.

15. The white LED according to claim 14, wherein the thickness of the reflecting film ranges from 1 to 10 nm.

16. The white LED according to claim 15, wherein the reflecting film is formed of a metallic material.

17. The white LED according to claim 16, wherein the reflecting film is formed of Cs.

18. The white LED according to claim 15, wherein the reflecting film is formed of a quasi-metallic material.

19. The white LED according to claim 18, wherein the reflecting film is formed of semiconductor of which the doping concentration is equal to or more than $5 \times 10^{21}$ cm$^{-3}$.

20. A method of manufacturing a white LED, comprising the steps of:
preparing a reflector cup;
mounting an LED chip on the bottom surface of the reflector cup;
forming a molding compound in the reflector cup such that the LED chip is surrounded by the molding compound;
forming a reflecting film on the molding compound; and
forming a phosphor layer on the reflecting film,
wherein a plasma wavelength of the reflecting film is larger than the wavelength of the light generated from the LED chip and is smaller than the wavelength of the phosphorescence generated from the phosphor layer.

21. The method according to claim 20, wherein the molding compound is formed of any one selected from the group consisting of PMMA, polystyrene, polyurethane, benzoguanamine resin, epoxy, and silicon resin.

22. The method according to claim 20, wherein the forming of the phosphor layer includes the steps of:
mixing transparent resin with phosphor materials, and then dispensing the transparent resin and the phosphor materials on the reflecting film; and
curing the transparent resin and the phosphor materials dispensed on the reflecting film.

23. The method according to claim 22, wherein the transparent resin is formed of any one selected from the group consisting of PMMA, polystyrene, polyurethane, benzoguanamine resin, epoxy, and silicon resin.

24. The method according to claim 20, wherein the thickness of the reflecting film ranges from 1 to 10 nm.

25. The method according to claim 20, wherein the reflecting film is formed of a metallic material.

26. The method according to claim 25, wherein the reflecting film is formed of Cs.

27. The method according to claim 20, wherein the reflecting film is formed of a quasi-metallic material.

28. The method according to claim 27, wherein the reflecting film is formed of semiconductor of which the doping concentration is equal to or more than $5 \times 10^{21}$ cm$^{-3}$.

* * * * *